(12) United States Patent
Park et al.

(10) Patent No.: US 10,090,835 B2
(45) Date of Patent: Oct. 2, 2018

(54) ON-DIE TERMINATION CIRCUIT, A MEMORY DEVICE INCLUDING THE ON-DIE TERMINATION CIRCUIT, AND A MEMORY SYSTEM INCLUDING THE MEMORY DEVICE

(71) Applicant: SAMSUNG ELECTRONICS CO., LTD., Suwon-si, Gyeonggi-Do (KR)

(72) Inventors: Ji-Woon Park, Suwon-si (KR); Byung-Ho Kim, Suwon-si (KR)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 15/465,771

(22) Filed: Mar. 22, 2017

(65) Prior Publication Data

US 2018/0026634 A1 Jan. 25, 2018

(30) Foreign Application Priority Data

Jul. 21, 2016 (KR) ........................ 10-2016-0092898

(51) Int. Cl.
| | | |
|---|---|---|
| *H03K 17/16* | (2006.01) | |
| *H03K 19/003* | (2006.01) | |
| *H03K 19/00* | (2006.01) | |
| *G11C 16/10* | (2006.01) | |
| *G11C 7/10* | (2006.01) | |
| *G11C 7/22* | (2006.01) | |

(52) U.S. Cl.
CPC ....... *H03K 19/0005* (2013.01); *G11C 7/1006* (2013.01); *G11C 7/1084* (2013.01); *G11C 7/22* (2013.01); *G11C 16/10* (2013.01); *H03K 19/0013* (2013.01)

(58) Field of Classification Search
CPC . H03K 19/0005; H03K 19/0013; G11C 16/10
USPC ........................................................... 326/30
See application file for complete search history.

(56) References Cited

U.S. PATENT DOCUMENTS

| | | |
|---|---|---|
| 7,671,622 B2 | 3/2010 | Oh et al. |
| 7,821,127 B2 | 10/2010 | Lee et al. |
| 8,107,271 B2 * | 1/2012 | Park .................. H03H 7/38 365/189.05 |
| 8,193,829 B2 | 6/2012 | Song |
| 8,238,175 B2 | 8/2012 | Fujisawa |
| 8,243,534 B2 | 8/2012 | Fujisawa |
| 8,610,460 B2 | 12/2013 | Kang |
| 8,896,340 B2 | 11/2014 | Kang |
| 8,928,349 B2 | 1/2015 | Oh et al. |
| 9,183,901 B2 | 11/2015 | Kim et al. |

(Continued)

FOREIGN PATENT DOCUMENTS

| | | |
|---|---|---|
| JP | 5591387 | 9/2014 |
| KR | 1020120048750 | 5/2012 |
| KR | 1020140014709 | 2/2014 |

*Primary Examiner* — Daniel D Chang
(74) *Attorney, Agent, or Firm* — F. Chau & Associates, LLC

(57) ABSTRACT

An on-die termination (ODT) circuit connected to an input buffer that receives a data signal, the ODT circuit includes at least one termination resistor connected to the input buffer and at least one switching device configured to control a connection between the termination resistor and the input buffer. The switching device is turned on or off according to information about the data signal.

9 Claims, 16 Drawing Sheets

(56) References Cited

U.S. PATENT DOCUMENTS

| | | | |
|---|---|---|---|
| 2011/0227604 A1* | 9/2011 | Nakagawa | H03K 19/01754 326/16 |
| 2016/0036438 A1 | 2/2016 | Kim et al. | |
| 2016/0087630 A1 | 3/2016 | Park et al. | |

* cited by examiner

ON-DIE TERMINATION CIRCUIT, A MEMORY DEVICE INCLUDING THE ON-DIE TERMINATION CIRCUIT, AND A MEMORY SYSTEM INCLUDING THE MEMORY DEVICE

CROSS-REFERENCE TO RELATED APPLICATION

This application claims priority under 35 U.S.C. § 119 to Korean Patent Application No. 10-2016-0092898, filed on Jul. 21, 2016, in the Korean Intellectual Property Office, the disclosure of which is incorporated by reference herein in its entirety.

TECHNICAL FIELD

The inventive concept relates to an on-die termination circuit, and more particularly, to a memory device including the on-die termination circuit and a memory system including the memory device.

DISCUSSION OF RELATED ART

Various kinds of memory devices have deteriorated signal integrity due to the increase of their capacities and operation speeds. For example, as the operation speeds of memory devices increase, the bandwidth of data transmitted through a channel connecting a memory controller to a memory device may increase. This may deteriorate signal quality. Accordingly, an on-die termination (ODT) circuit has been used to reduce signal noise. However, use of the ODT circuit may result in increased power consumption and increased temperatures.

SUMMARY

According to an exemplary embodiment of the inventive concept, there is provided an on-die termination (ODT) circuit connected to an input buffer that receives a data signal. The ODT circuit includes: at least one termination resistor connected to the input buffer; and at least one switching device configured to control a connection between the termination resistor and the input buffer. The switching device is turned on or off according to information about the data signal.

According to an exemplary embodiment of the inventive concept, there is provided a memory device including: an input buffer configured to receive a data signal; an ODT circuit connected to the input buffer; and an ODT controller configured to detect a pattern of the data signal and control turning-on and off of the ODT circuit in response to the pattern of the data signal.

According to an exemplary embodiment of the inventive concept, there is provided a memory system including: a memory device including a first memory device and a second memory device. The first memory device includes at least one first ODT circuit and the second memory device includes at least one second ODT circuit. The memory system further includes a memory controller configured to provide the first memory device with a first data signal through a first channel, provide the second memory device with a second data signal through a second channel, and control turning-on and off of the first and second ODT circuits according to patterns of the first and second data signals, respectively.

According to an exemplary embodiment of the inventive concept, there is provided a memory device including: an input buffer that receives a data signal at an input terminal; an ODT circuit connected to the input terminal of the input buffer, wherein the ODT circuit includes a first resistor connected to a supply voltage, a second resistor connected to a ground voltage, a first switch connected to the first resistor and a second switch connected to the second resistor; and an ODT controller connected to an output terminal of the input buffer, the ODT controller configured to receive the data signal from the input buffer, generate a control signal in response to the data signal and provide the control signal to the ODT circuit.

BRIEF DESCRIPTION OF THE DRAWINGS

The above and other features of the inventive concept will become more clearly understood by describing in detail exemplary embodiments thereof with reference to the accompanying drawings in which.

DETAILED DESCRIPTION OF THE EMBODIMENTS

Figure 1:
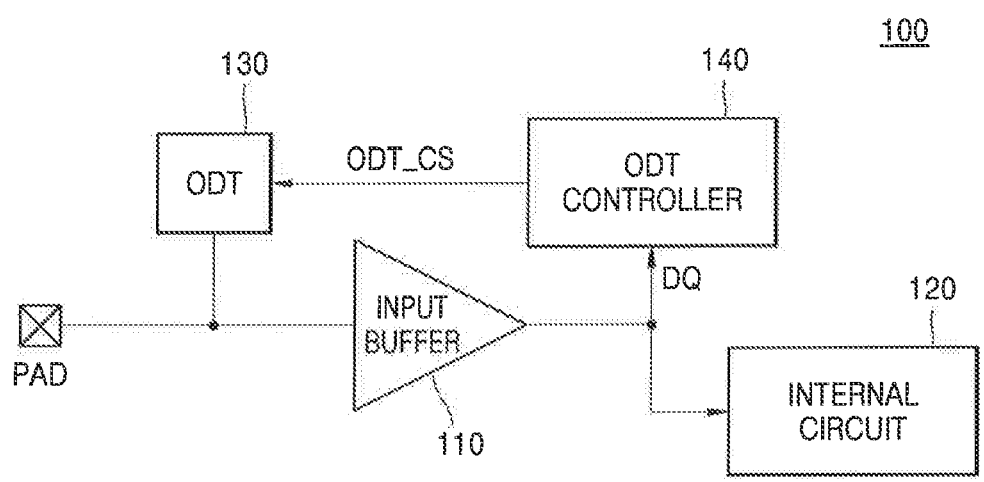
FIG. 1 is a block diagram of a memory device including an on-die termination (ODT) circuit according to an exemplary embodiment of the inventive concept.

FIG. 1 is a block diagram of a memory device including an on-die termination (ODT) circuit according to an exemplary embodiment of the inventive concept.

Referring to FIG. 1, a memory device 100 may include an input buffer 110, an internal circuit 120, an on-die termination (ODT) circuit 130, and an ODT controller 140. The input buffer 110 may receive a data signal DQ from the outside through a pad PAD. The input buffer 110 may transfer the received data signal DQ to the internal circuit 120. While the ODT circuit 130 is turned on, the ODT circuit 130 may suppress signal reflection at an input stage of the input buffer 110 when the input buffer 110 receives the data signal DQ by providing an impedance-matching resistance component to the input stage of the input buffer 110. In other words, the ODT circuit 130 may be connected to the input stage of the input buffer 110 to increase signal integrity. According to an exemplary embodiment of the inventive concept, the ODT circuit 130 may include a termination resistor configured to provide a resistance component to the input stage of the input buffer 110, and a switching device configured to control a connection of the termination resistor to the input stage of the input buffer 110.

The ODT controller 140 may receive the data signal DQ from the input buffer 110, generate an ODT control signal ODT_CS by using the data signal DQ, and provide the ODT circuit 130 with the ODT control signal ODT_CS to control turning on and off of the ODT circuit 130. However, the ODT controller 140 may directly receive the data signal DQ from the outside as well. According to an exemplary embodiment of the inventive concept, the ODT controller 140 may control the turning on and off of the ODT circuit 130 according to a pattern of the data signal DQ. Further, the ODT controller 140 may control the turning on and off of the ODT circuit 130 based on, for example, information of a frequency of the data signal DQ and/or a length of a channel through which the data signal DQ is transmitted. A channel through which the data signal DQ is transmitted may be, e.g., a transmission line between an output buffer of a memory controller sending the data signal DQ and an input buffer of the memory device receiving the data signal DQ or a transmission line between a terminal connected to the output buffer of the memory controller and a terminal connected to the input buffer of the memory device. The ODT controller 140 may receive the information of the frequency and the channel length from the outside or obtain the frequency information of the data signal DQ based on frequency information of an internal clock signal. However, the acquisition methods described above are merely exemplary and the inventive concept is not limited thereto. The information including at least one of the pattern information of the data signal DQ, the frequency information of the data signal DQ, and the channel length information may be referred to as information about the data signal DQ hereinafter. For example, the ODT controller 140 may control turning on and turning off of the ODT circuit 130 based on the information about the data signal DQ.

In a memory system including the memory device 100, an increase in the length of the channel through which the data signal DQ is transmitted and an increase in the frequency of the data signal DQ may result in an impedance mismatching. Impedance mismatching may induce a noise arising from a reflection of the data signal DQ. To reduce the noise, the ODT controller 140 determines whether the ODT circuit 130 is to be turned on or off. For example, the ODT controller 140 may control the turning on and the turning off of the ODT circuit 130 after a predetermined delay interval based on a determination result. In other words, the ODT controller 140 may control the ODT circuit 130 such that a time when the ODT circuit 130 is turned-on and off is different from a time when an on-state and an off-state of the ODT circuit 130 is determined.

For example, the detection of the pattern of the data signal DQ may mean the detection of a change in a level state of the data signal DQ. In such a case, the ODT controller 140 may determine that the ODT circuit 130 is to be turned on when the level of the data signal DQ changes states and determine that the ODT circuit 130 is to be turned off when the level of the data signal DQ is maintained. The ODT controller 140 may control the turning on and off of the ODT circuit 130 after the delay interval based on the determination result. According to an exemplary embodiment of the inventive concept, the ODT controller 140 may set the delay interval differently depending on the frequency information of the data signal DQ and/or the length information of the channel through which the data signal DQ is transmitted. This is described below in detail. In an exemplary embodiment of the inventive concept, the ODT controller 140 may not maintain the delay interval between the timing of controlling the turning on and the turning off of the ODT circuit 130 and the timing of determining the on-state and off-state of the ODT circuit 130. In this case, the timing of determining the on-state and off-state of the ODT circuit 130 is identical to or approximately the same as the timing of controlling the turning on and the turning off of the ODT circuit 130.

According to an exemplary embodiment of the inventive concept, the ODT controller 140 may control the ODT circuit 130 such that the turned-on state or the turned-off state is maintained during a predetermined sustaining period. In other words, the ODT controller 140 may control the ODT circuit 130 such that the state of the ODT circuit 130 changes from a turned-off state to a turned-on state or from the turned-on state to the turned-off state, or the ODT circuit 130 maintains the turned-off state or the turned-on state depending on the pattern of the data signal DQ. In addition, the ODT controller 140 may control the ODT circuit 130 such that the state of the ODT circuit 130 is maintained during the predetermined sustaining period. The ODT controller 140 may set the length of the sustaining period differently depending on the frequency information of the data signal DQ and/or the length information of the channel through which the data signal DQ is transmitted. Further, the ODT controller 140 may set the sustaining period that the ODT circuit 130 maintains the turned-on state differently from the sustaining period that the ODT circuit 130 maintains the turned-off state. This is described below in detail. In addition, although FIG. 1 illustrates that the ODT controller 140 is included in the memory device 100, the location of the ODT controller 140 is not limited thereto and may be included in the memory controller. This is described below in detail.

The ODT controller 140 of the memory device 100 according to an exemplary embodiment of the inventive concept dynamically controls the turning on and off of the ODT circuit 130 based on the pattern of the data signal DQ while the memory device 100 operates in a read mode or a write mode. Therefore, power consumption in the ODT circuit 130 is reduced and impedance matching is achieved effectively.

Figure 2:
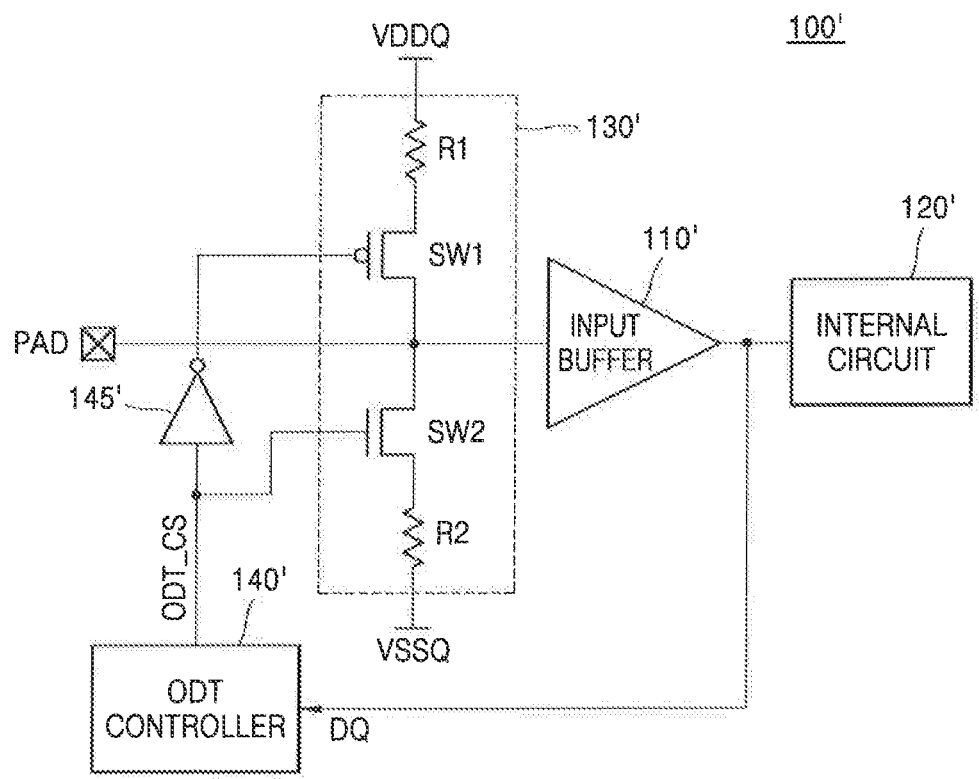
FIG. 2 is a detailed block diagram of an ODT circuit according to an exemplary embodiment of the inventive concept.

FIG. 2 illustrates an ODT circuit according to an exemplary embodiment of the inventive concept in detail.

Referring to FIG. 2, a memory device 100' may include an input buffer 110', an internal circuit 120', an ODT circuit 130', an ODT controller 140', and an inverter 145'. The ODT circuit 130' according to an exemplary embodiment of the inventive concept may include a first resistor R1 having one end connected to a supply voltage VDDQ and a second resistor R2 having one end connected to a ground voltage VSSQ. In addition, the ODT circuit 130' may further include a first switch SW1 connected between the other end of the first resistor R1 and an input terminal of the input buffer 110', and a second switch SW2 connected between the other end of the second resistor R2 and the input terminal of the input buffer 110'. The ODT controller 140' may generate the ODT control signal ODT_CS based on the pattern of the data signal DQ to provide the ODT control signal ODT_CS to the ODT circuit 130'. An on or off state of each of the first and second switches SW1 and SW2 may be controlled according to the ODT control signal ODT_CS.

The ODT controller 140' may control the first and second switches SW1 and SW2 to turn on when the level of the data signal DQ changes states, so that the ODT circuit 130' is turned on. In addition, the ODT controller 140' may control the first and second switches SW1 and SW2 to turn off when the data signal DQ maintains a predetermined level, so that the ODT circuit 130' is turned off.

The ODT circuit 130' shown in FIG. 2 is merely exemplary, and the inventive concept is not limited thereto. For example, the ODT circuit 130' may be implemented by using various circuits. For example, the ODT circuit 130' may be implemented by use of an output buffer included in the memory device 100'. In other words, when the memory device 100' sends read-out data to an external device, e.g., the memory controller, some circuits within the output buffer of the memory device 100' that outputs the read-out data may operate as the ODT circuit 130' while receiving the data signal DQ.

Figure 3:
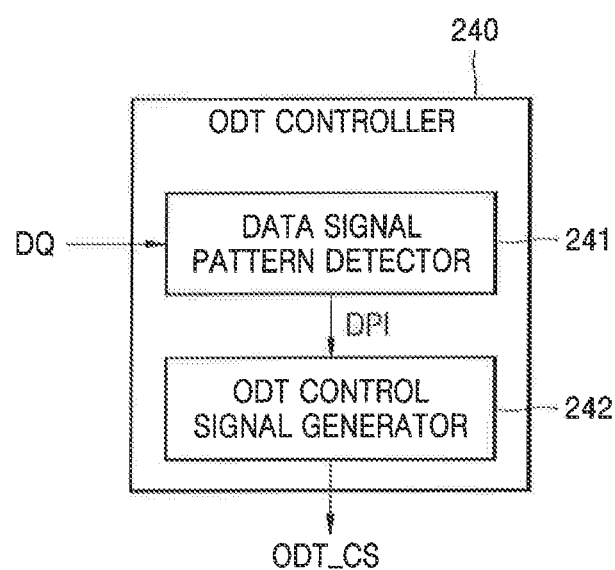
FIG. 3 is a block diagram of an ODT controller according to an exemplary embodiment of the inventive concept.
Figure 4:
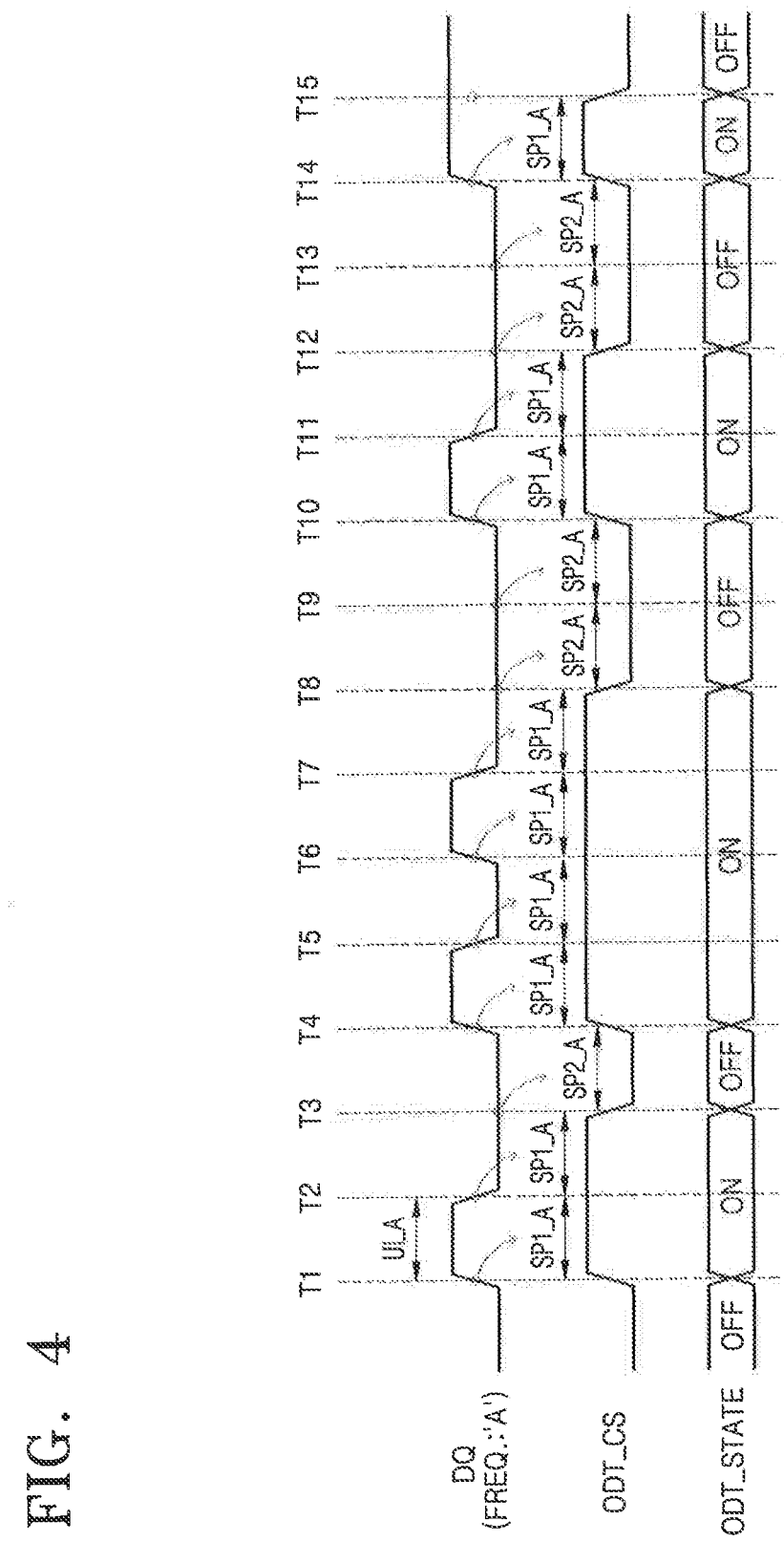
FIG. 4 is a timing diagram for explaining a method of controlling an ODT circuit according to an exemplary embodiment of the inventive concept.

FIG. 3 is a block diagram of an ODT controller according to an exemplary embodiment of the inventive concept. FIG. 4 is a timing diagram for explaining a method of controlling an ODT circuit according to an exemplary embodiment of the inventive concept.

Referring to FIG. 3, an ODT controller 240 may include a data signal pattern detector 241 and an ODT control signal generator 242. The data signal pattern detector 241 according to an exemplary embodiment of the inventive concept may receive the data signal DQ and detect the pattern of the data signal DQ. For example, the data signal pattern detector 241 may detect whether the level of the data signal DQ changes or not to generate data pattern information DPI. The ODT control signal generator 242 may generate the ODT control signal ODT_CS based on the data pattern information DPI to provide to an ODT circuit. Although the data signal pattern detector 241 and the ODT control signal generator 242 are depicted separately in FIG. 3, the data signal pattern detector 241 and the ODT control signal generator 242 may be integrated into a single block or circuit. This is described below in detail.

Referring to FIGS. 3 and 4, the data signal DQ may be divided into unit intervals UI_A each of which has a predetermined length. The unit interval UI_A may represent a bit period of the data signal DQ. In other words, the unit interval UI_A may correspond to a reciprocal number of a frequency of the data signal DQ. In an exemplary embodiment of the inventive concept, the frequency of the data signal DQ is assumed to be 'A' Hz, and the interval between a first time T1 and a second time T2 may correspond to the unit interval UI_A. The data signal pattern detector 241 may detect whether the level of the data signal DQ changes at the time T1. For example, the data signal pattern detector 241 may detect a transition of the data signal DQ from a low state to a high state at the time T1, and the ODT control signal generator 242 may generate the ODT control signal ODT_CS, in response to the data pattern information DPI indicating the detection result, to turn on the ODT circuit. Thus, the ODT control signal generator 242 may generate the ODT control signal ODT_CS of the high state during a first sustaining period SP1_A from the first time T1. The ODT circuit may be turned on by the ODT control signal ODT_CS and maintain the turned-on state during the first sustaining period SP1_A.

Afterwards, the data signal pattern detector 241 may detect whether the level of the data signal DQ changes at the second time T2. For example, the data signal pattern detector 241 may detect the transition of the data signal DQ from the high state to the low state at the second time T2, and the ODT control signal generator 242 may generate the ODT control signal ODT_CS, in response to the data pattern information DPI indicating the detection result, to turn on the ODT circuit. The ODT control signal generator 242 may generate the ODT control signal ODT_CS of the high state during the first sustaining period SP1_A from the second time T2. The ODT circuit may maintain the turned-on state during the first sustaining period SP1_A like before in response to the ODT control signal ODT_CS.

The data signal pattern detector 241 may detect whether the level of the data signal DQ changes at a third time T3. For example, the data signal pattern detector 241 may detect that the data signal DQ maintains the low state at the third time T3, and the ODT control signal generator 242 may generate the ODT control signal ODT_CS, in response to the data pattern information DPI indicating the detection result, to turn off the ODT circuit. The ODT control signal generator 242 may generate the ODT control signal ODT_CS of the low state during a second sustaining period SP2_A from the third time T3. The ODT circuit may be turned off by the ODT control signal ODT_CS and maintain the turned-off state during the second sustaining period SP2_A in response to the ODT control signal ODT_CS.

The data signal pattern detector 241 may detect whether the level of the data signal DQ changes at a fourth time T4. For example, the data signal pattern detector 241 may detect the transition of the data signal DQ from the low state to the high state at the fourth time T4, and the ODT control signal generator 242 may generate the ODT control signal ODT_CS, in response to the data pattern information DPI indicating the detection result, to turn on the ODT circuit. The ODT control signal generator 242 may generate the ODT control signal ODT_CS of the high state during the first sustaining period SP1_A from the fourth time T4. The ODT circuit may be turned on by the ODT control signal ODT_CS and maintain the turned-on state during the first sustaining period SP1_A from the fourth time T4 in response to the ODT control signal ODT_CS.

As described above, the data signal pattern detector 241 may detect the pattern of the data signal DQ at a predetermined frequency, and the ODT control signal generator 242 may generate the ODT control signal ODT_CS according to the detected pattern of the data signal DQ to provide the ODT control signal ODT_CS to the ODT circuit. The data signal pattern detector 241 according to an exemplary embodiment of the inventive concept may detect the pattern of the data signal DQ in a period of the unit interval UI_A. In addition, the data signal pattern detector 241 may detect the pattern of the data signal DQ in a period of a plurality of unit intervals. However, the inventive concept is not limited thereto. For example, the data signal pattern detector 241 may detect the pattern of the data signal DQ aperiodically, and the ODT control signal generator 242 may generate the ODT control signal ODT_CS according to the pattern of the aperiodically detected data signal DQ.

In addition, the ODT control signal generator 242 may change durations of the first sustaining period SP1_A that is used for maintaining the turned-on state of the ODT circuit and the second sustaining period SP2_A that is used for maintaining the turned-off state of the ODT circuit. According to an exemplary embodiment of the inventive concept, the ODT control signal generator 242 may change the durations of the first and second sustaining periods SP1_A and SP2_A relative to the unit interval UI_A. For example, the ODT control signal generator 242 may change ratios SP1_A/UI-A and SP2_A/UI-A of the durations of first and second sustaining periods SP1_A and SP2_A to the unit interval UI_A. As shown in FIG. 4, the ODT control signal generator 242 may set the ratios SP1_A/UI-A and SP2_A/UI-A to '1'. In other words, the ODT control signal generator 242 may set the durations of the first and second sustaining periods SP1_A and SP2_A to be the same as the unit interval UI_A. Further, the ODT control signal generator 242 may set the durations of the first and second sustaining periods SP1_A and SP2_A to be the same as a duration of more than one unit interval UI_A. However, the inventive concept is not limited thereto. For example, the ODT control signal generator 242 may set the durations of the first and second sustaining periods SP1_A and SP2_A in various manners, so that the ratios SP1_A/UI-A and SP2_A/UI-A of the durations of the first and second sustaining periods SP1_A and SP2_A to the unit interval UI_A have various values.

In an exemplary embodiment of the inventive concept, the ODT control signal generator 242 may set the durations of the first and second sustaining periods SP1_A and SP2_A to be different from each other and generate the ODT control signal ODT_CS based on differentiated durations. For example, a time interval in which the ODT circuit maintains the turned-on state with the ODT control signal ODT_CS may differ from another time interval in which the ODT circuit maintains the turned-off state.

In considering that noise due to impedance mismatching is generated during the transition intervals of the data signal DQ, the ODT controller 240 according to an exemplary embodiment of the inventive concept is configured to turn on the ODT circuit selectively, e.g., only in the transition intervals of the data signal DQ. Therefore, an effective circuit termination is provided and signal integrity is increased while suppressing power consumption in the ODT circuit.

Figure 5A:
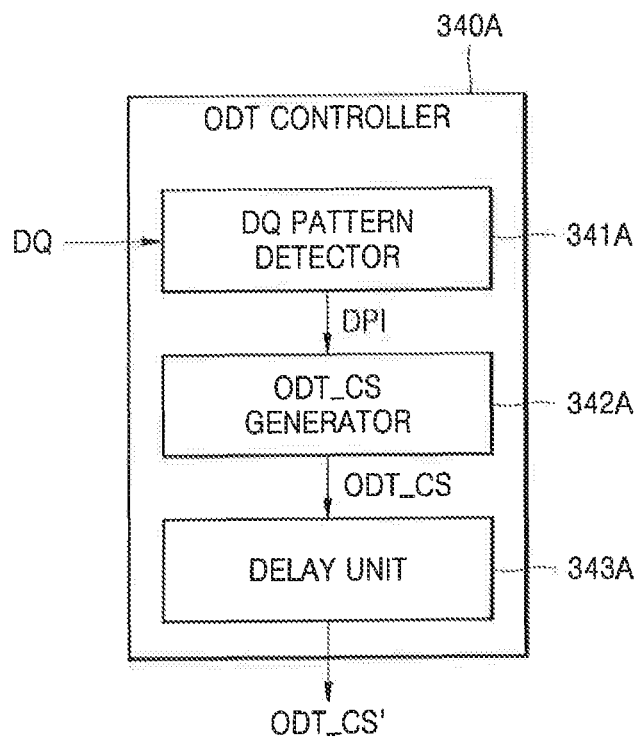
FIG. 5A is a block diagram of an ODT controller according to an exemplary embodiment of the inventive concept.
Figure 5B:
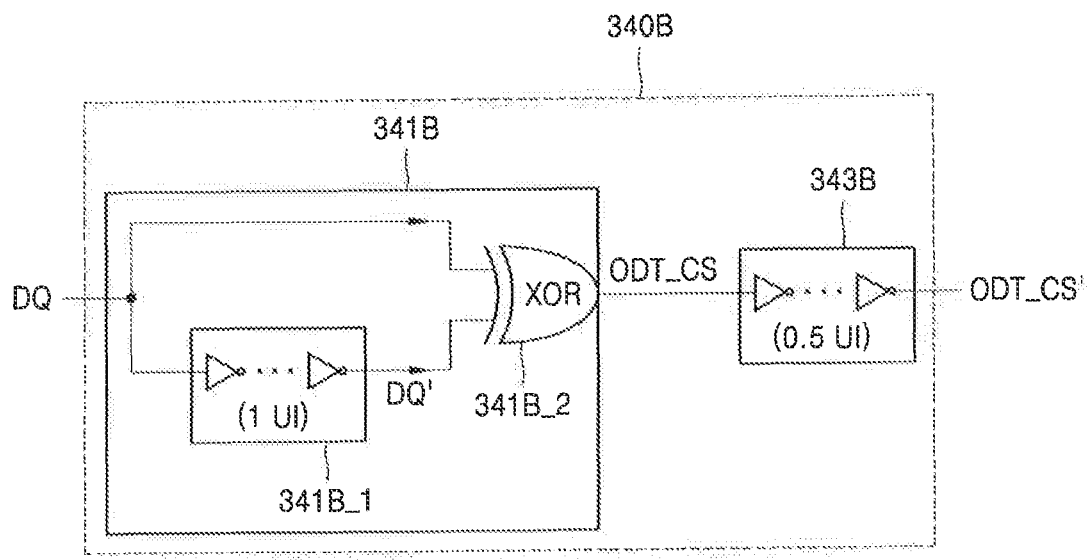
FIG. 5B is a circuit diagram of an ODT controller according to an exemplary embodiment of the inventive concept.
Figure 6:
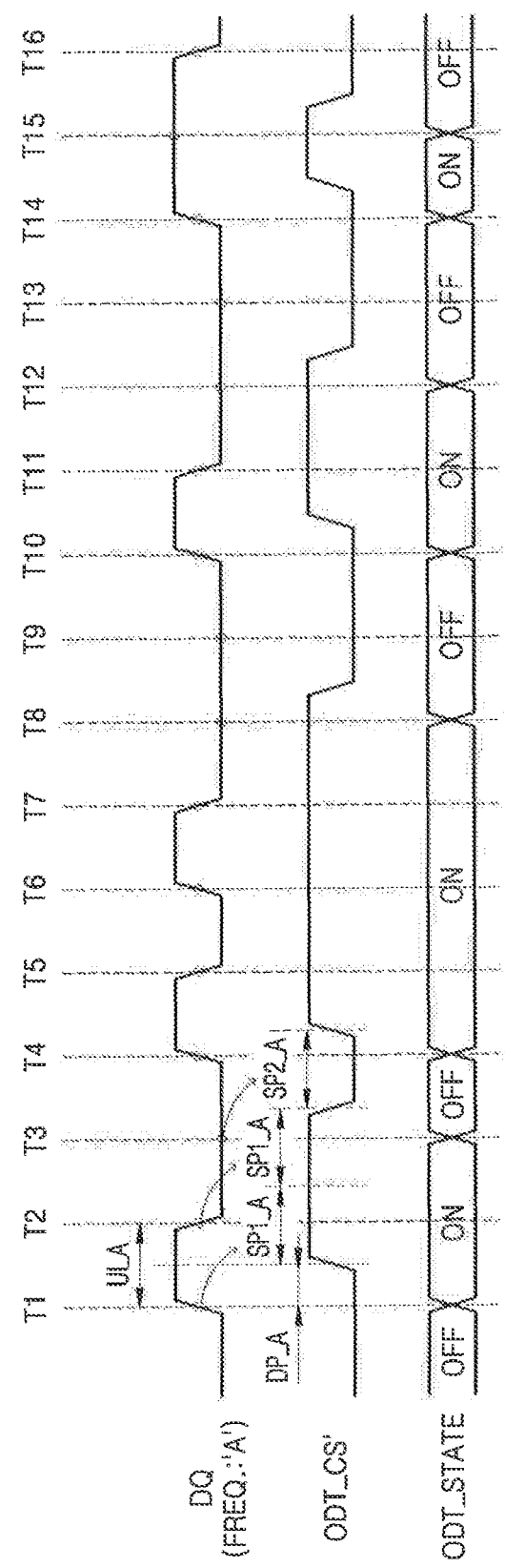
FIG. 6 is a timing diagram for explaining a method of controlling an ODT circuit according to an exemplary embodiment of the inventive concept.

FIG. 5A is a block diagram of an ODT controller according to an exemplary embodiment of the inventive concept. FIG. 5B is a circuit diagram of an ODT controller according to an exemplary embodiment of the inventive concept. FIG. 6 is a timing diagram for explaining a method of controlling an ODT circuit according to an exemplary embodiment of the inventive concept.

Referring to FIG. 5A, an ODT controller 340A may include a data signal pattern detector 341A, an ODT control signal generator 342A, and a delay unit 343A. In comparison with the ODT controller 240 of FIG. 3, the ODT controller 340A of FIG. 5A further includes the delay unit 343A. Since the data signal pattern detector 341A and the ODT control signal generator 342A shown in FIG. 5A are similar to those shown in FIG. 3, the ODT controller 340A will be described below with an emphasis on the delay unit 343A.

The delay unit 343A may delay the ODT control signal ODT_CS generated by the ODT control signal generator 342A based on the pattern of the data signal DQ by a prescribed delay time and provide a delayed ODT control signal ODT_CS' to the ODT circuit. A delay of the noise resulting from the reflection of the data signal DQ input to the memory device depends on the length of the channel through which the data signal DQ is transmitted or the frequency of the data signal DQ, for example. Accordingly, the delay unit 343A in accordance with an exemplary embodiment of the inventive concept may delay the ODT control signal ODT_CS by the delay interval whose duration is changed based on the length information of the channel through which the data signal DQ is transmitted and the frequency of the data signal DQ to control the turning-on and off of the ODT circuit in a timing when a delayed noise is generated. In an exemplary embodiment of the inventive concept, however, the delay unit 343A may be included in the ODT control signal generator 342A, and the ODT control signal ODT_CS generated by the ODT control signal generator 342A may include the delay interval introduced by the delay unit 343A.

Referring to FIGS. 5A, and 6, according to an exemplary embodiment of the inventive concept, the delay unit 343A may delay the ODT control signal ODT_CS by a prescribed delay time DP_A and provide a delayed ODT control signal ODT_CS' to the ODT circuit. According to an exemplary embodiment of the inventive concept, turning-on and off of the ODT circuit may be controlled by the delayed ODT control signal ODT_CS' in a timing when the delayed noise is generated. For example, the delay unit 343A may set a delay interval corresponding to a noise delay timing and provide the ODT control signal ODT_CS delayed by the delay interval to the ODT circuit, so that the ODT circuit may be turned on or maintained in the turned-on state in a timing when the delayed noise is generated.

According to an exemplary embodiment of the inventive concept, when the delay unit 343A changes the duration of the delay interval DP_A, the delay unit 343A may change the duration of the delay interval DP_A relative to the unit interval UI_A of the data signal DQ. For example, the delay unit 343A may change a ratio DP_A/UI-A of the delay interval DP_A to the unit interval UI_A. As shown in FIG. 6, the delay unit 343A may set the ratio DP_A/UI-A to '0.5' in setting the delay interval of the ODT control signal ODT_CS. However, the inventive concept is not limited thereto. For example, the delay unit 343A may set the delay interval DP_A in various manners, so that the ratio DP_A/UI-A of the delay interval DP_A to the unit interval UI_A is varied accordingly.

Referring to FIG. 5B, an ODT controller 340B may include an ODT control signal generator 341B and a delay unit 343B. The ODT control signal generator 341B is configured to detect the pattern of the data signal DQ and generate the ODT control signal ODT_CS based on the pattern of the data signal DQ. The configuration of the data signal pattern detector 341A and the ODT control signal generator 342A shown in FIG. 5A may be incorporated in the ODT control signal generator 341B of FIG. 5B. The ODT control signal generator 341B may include a delay unit 341B_1 having at least one delay element for delaying the data signal DQ by a delay interval corresponding to one unit interval (1 UI), and an exclusive-OR (XOR) gate 341B_2 for comparing a delayed data signal DQ' with the data signal DQ to detect a level transition of the data signal DQ and generate the ODT control signal ODT_CS based on a detected result. The delay unit 343B has at least one delay element and delays the ODT control signal ODT_CS by a delay interval corresponding to half a unit interval (0.5 UI) to generate the delayed ODT control signal ODT_CS'.

By using such a circuit configuration, the ODT controller 340B may generate the delayed ODT control signal ODT_CS' shown in FIG. 6 to control the ODT circuit. However, the inventive concept is not limited thereto. For example, the circuit configuration of the ODT controller 340B for performing the functions described above may be implemented in various manners.

Figure 7A:
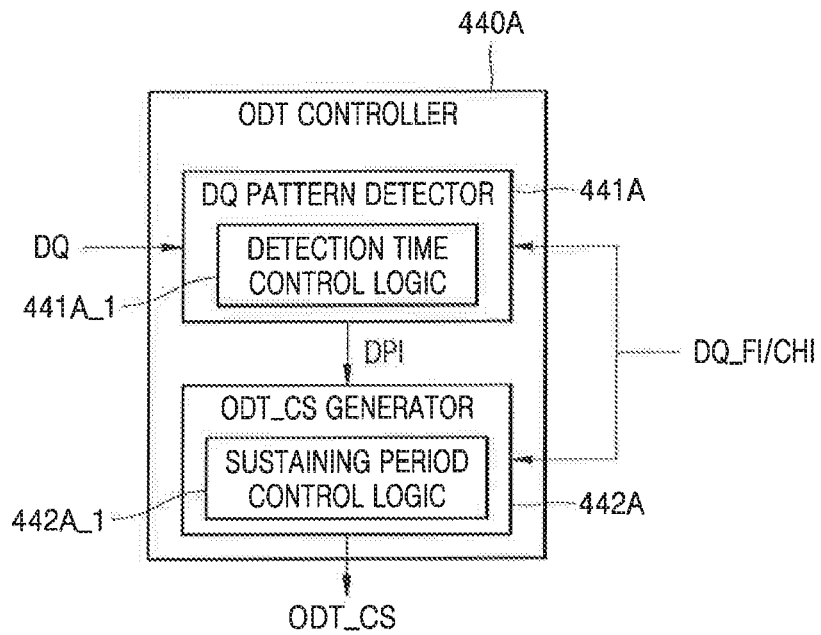
FIGS. 7A and 7B are block diagrams of ODT controllers according to exemplary embodiments of the inventive concept.
Figure 7B:
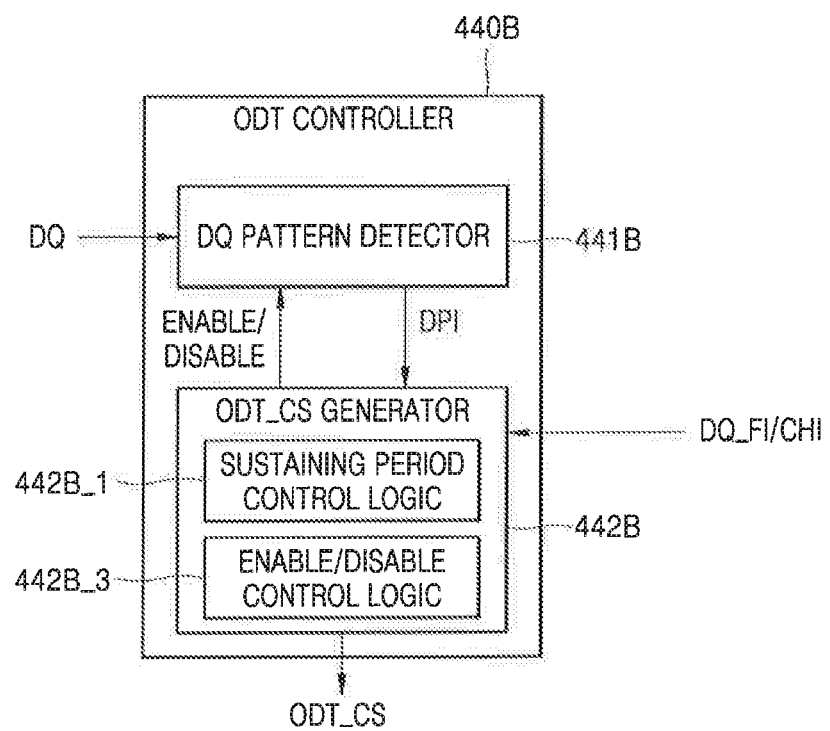

FIGS. 7A and 7B are block diagrams of ODT controllers according to exemplary embodiments of the inventive concept.

Referring to FIG. 7A, an ODT controller 440A may include a data signal pattern detector 441A and an ODT control signal generator 442A. The data signal pattern detector 441A may include a detection timing control logic 441A_1. According to an exemplary embodiment of the inventive concept, the data signal pattern detector 441A may detect the pattern of the data signal DQ. For example, the data signal pattern detector 441A may detect periodically or aperiodically whether the level of the data signal DQ changes to generate data pattern information DPI and provide the data pattern information DPI to the ODT control signal generator 442A. Here, the detection timing control logic 441A_1 may control a timing to detect the pattern of the data signal DQ for the data signal pattern detector 441A. Accordingly, the data signal pattern detector 441A may detect a level change of the data signal DQ at a predetermined detection timing, and the power consumption required to detect the pattern of the data signal DQ for the detection timing control logic 441A_1 may be reduced.

The detection timing control logic 441A_1 may control the detection timing such that the data signal pattern detector 441A may detect the pattern of the data signal DQ in a period corresponding to at least one unit interval. For example, under the control of the detection timing control logic 441A_1, the data signal pattern detector 441A may detect the pattern of the data signal DQ in a period corresponding to one unit interval or in a period corresponding to two unit intervals. Although the period that the data signal pattern detector 441A detects the pattern of the data signal DQ is described above in terms of the unit interval, the inventive concept is not limited thereto. For example, the period may be set in terms of a cycle of an internal clock signal of the memory device including the ODT controller 440A or the memory controller. Further, the period may be set in terms of another prescribed unit time interval. Hereinafter, described is the operation of controlling the ODT circuit in terms of the unit interval of the data signal DQ.

The data signal pattern detector 441A according to an exemplary embodiment of the inventive concept may receive data signal frequency information DQ_FI or channel length information CHI. The data signal frequency information DQ_FI described below may be acquired by using frequency information of the internal clock signal of the memory device including the ODT controller 440A or the memory controller. However, the inventive concept is not limited thereto. For example, the data signal frequency information DQ_FI may be acquired by other methods. In addition, although it is shown in FIG. 7A that the data signal pattern detector 441A and the ODT control signal generator 442A of the ODT controller 440A receive the data signal frequency information DQ_FI or the channel length information CHI from the outside, the data signal frequency information DQ_FI or the channel length information CHI may correspond to information stored in a storage area of ODT controller 440A.

According to an exemplary embodiment of the inventive concept, the data signal pattern detector 441A may detect the pattern of the data signal DQ, and change the ratio of the duration of a detection period to the unit interval of the data signal DQ based on at least one of the data signal frequency information DQ_FI and the channel length information CHI. For example, the detection timing control logic 441A_1 may control the data signal pattern detector 441A with reference to the data signal frequency information DQ_FI such that the ratio of the duration of the data signal DQ to the unit interval of the data signal DQ increases as the frequency of the data signal DQ increases. However, the inventive concept is not limited thereto. For example, the detection timing control logic 441A_1 may control the data signal pattern detector 441A with reference to the data signal frequency information DQ_FI such that the ratio of the duration of the data signal DQ to the unit interval of the data signal DQ increases as the frequency of the data signal DQ increases when the frequency of the data signal DQ is above a certain criterion. In addition, the detection timing control logic 441A_1 may control the data signal pattern detector 441A such that the ratio of the duration of the data signal DQ to the unit interval of the data signal DQ decreases as the frequency of the data signal DQ increases when the frequency of the data signal DQ is below the criterion. For example, the detection timing control logic 441A_1 may control the data signal pattern detector 441A such that the data signal pattern detector 441A performs a detecting operation of the pattern of the data signal DQ in the period of one unit interval when the frequency of the data signal DQ is 'X' Hz while performing the detecting operation of the pattern of the data signal DQ in the period of two unit intervals when the frequency of the data signal DQ is '2X' Hz.

The detection timing control logic 441A_1 may control the data signal pattern detector 441A with reference to the channel length information CHI such that the ratio of the duration of the data signal DQ to the unit interval of the data signal DQ increases as the length of the channel through which the data signal DQ is transmitted increases. However, the inventive concept is not limited thereto. For example, the detection timing control logic 441A_1 may control the data signal pattern detector 441A with reference to the channel length information CHI such that the duration of the data signal DQ increases as the channel length increases when the channel length is above a certain criterion. In addition, the detection timing control logic 441A_1 may control the data signal pattern detector 441A while the duration of the data signal DQ decreases as the channel length increases when the channel length is below the criterion.

According to an exemplary embodiment of the inventive concept, the ODT control signal generator 442A may include a sustaining period control logic 442A_1. The ODT control signal generator 442A may generate the ODT control signal ODT_CS based on data pattern information DPI. The ODT control signal generator 442A may control turning-on and off of the ODT circuit and maintaining of the turning-on and off state of the ODT circuit during the sustaining period by providing the ODT circuit with the ODT control signal ODT_CS.

Here, the sustaining period control logic 442A_1 may control the ODT control signal generator 442A to change the turned-on and off state of the ODT circuit and the duration of the sustaining period. For example, the ODT control signal generator 442A may generate the ODT control signal ODT_CS, under the control of the sustaining period control logic 442A_1, to make the ODT circuit maintain the turned-on or off state during the sustaining period corresponding to one unit interval or two unit intervals. Although the sustaining period is described above in terms of the unit interval of the data signal DQ, the inventive concept is not limited thereto. For example, the sustaining period may be set in terms of the cycle of the internal clock signal of the memory device including the ODT controller 440A or the memory controller. Further, the sustaining period may be set in terms of another prescribed unit time interval.

The ODT control signal generator 442A according to an exemplary embodiment of the inventive concept may receive the data signal frequency information DQ_FI or the channel length information CHI. According to an exemplary embodiment of the inventive concept, the ODT control signal generator 442A may control the ODT circuit, based on at least one of the data signal frequency information DQ_FI and the channel length information CHI. For example, the sustaining period control logic 442A_1 may control the ODT control signal generator 442A with reference to the data signal frequency information DQ_FI such that the ratio of the duration of the sustaining period to the unit interval of the data signal DQ increases as the frequency of the data signal DQ increases. However, the inventive concept is not limited thereto. For example, the sustaining period control logic 442A_1 may control the ODT control signal generator 442A with reference to the data signal frequency information DQ_FI such that the ratio of the duration of the sustaining period to the unit interval of the data signal DQ increases as the frequency of the data signal DQ increases when the frequency of the data signal DQ is above a certain criterion. In addition, the sustaining period control logic 442A_1 may control the ODT control signal generator 442A such that the ratio of the duration of the sustaining period to the unit interval of the data signal DQ decreases as the frequency of the data signal DQ increases when the frequency of the data signal DQ is below the criterion. For example, the sustaining period control logic 442A_1 may control the ODT control signal generator 442A such that the duration of the sustaining period of the turning-on or off state of the ODT circuit corresponds to one unit interval of the data signal DQ when the frequency of the data signal DQ is 'X' Hz while the duration of the sustaining period of the turning-on or off state of the ODT circuit corresponds to two unit intervals when the frequency of the data signal DQ is '2X' Hz.

The sustaining period control logic 442A_1 may control the ODT control signal generator 442A with reference to the channel length information CHI such that the ratio of the duration of the sustaining period to the unit interval of the data signal DQ increases as the channel length increases. However, the inventive concept is not limited thereto. For example, the sustaining period control logic 442A_1 may control ODT control signal generator 442A with reference to channel length information CHI such that the duration of the sustaining period increases as the channel length increases when the channel length is above a certain criterion. In addition, the sustaining period control logic 442A_1 may control ODT control signal generator 442A while the duration of the sustaining period decreases as the channel length increases when the channel length is below the criterion.

In addition, as mentioned above, the ODT control signal generator 442A may generate the ODT control signal ODT_CS in such a way that the duration of the sustaining period of the turned-on state of the ODT circuit is different from the duration of the sustaining period of the turned-off state of the ODT circuit. This is described in detail below.

As described above, an exemplary embodiment of the inventive concept may control the detection period for the pattern of the data signal DQ and the sustaining period of the turned-on and off state of the ODT circuit based on at least one of the data signal frequency information DQ_FI and the channel length information CHI, thereby enabling effective termination of the ODT circuit while reducing the power that the ODT controller 440A consumes to control the ODT circuit.

Referring to FIG. 7B, an ODT controller 440B may include a data signal pattern detector 441B and an ODT control signal generator 442B. The ODT control signal generator 442B may include a sustaining period control logic 442B_1 and an enable/disable control logic 442B_3. Since the sustaining period control logic 442B_1 is similar to the sustaining period control logic 442A_1 which was described in detail with reference to FIG. 7A, the following description of the ODT controller 440B shown in FIG. 7B will be focused on the enable/disable control logic 442B_3.

The enable/disable control logic 442B_3 may control an enablement or disablement of the data signal pattern detector 441B based on the sustaining period of the turned-on or off state of the ODT circuit. For example, when the ODT controller 440B receives the data signal DQ, the enable/disable control logic 442B_3 may enable the data signal pattern detector 441B. When enabled, the data signal pattern detector 441B may detect the level change of the data signal DQ. The data signal pattern detector 441B may generate the data pattern information DPI by detecting the level change of the data signal DQ to provide the ODT control signal generator 442B with the data pattern information DPI. Afterwards, the enable/disable control logic 442B_3 may disable the data signal pattern detector 441B. In addition, the ODT control signal generator 442B may provide the ODT circuit with the ODT control signal ODT_CS based on the data pattern information DPI, so that the ODT circuit is turned on when the level transition of the data signal DQ occurs and maintains the turned-on state during a first sustaining period. The enable/disable control logic 442B_3 may enable the data signal pattern detector 441B when the first sustaining period ends. The ODT control signal generator 442B may provide the ODT circuit with the ODT control signal ODT_CS based on the data pattern information DPI, so that the ODT circuit is turned off when the level of the data signal DQ is unchanged and maintains the turned-off state during a second sustaining period. The enable/disable control logic 442B_3 may enable the data signal pattern detector 441B in a timing that the second sustaining period ends.

As described above, different than that shown in FIG. 7A, the ODT control signal generator 442B of the ODT controller 440B shown in FIG. 7B may directly control the enablement or disablement of the data signal pattern detector 441B when the sustaining period of the turned-on or off state of the ODT circuit ends. Therefore, the detection of the pattern of the data signal DQ is carried out only when necessary in controlling the turning-on or off of the ODT circuit.

Figure 8:
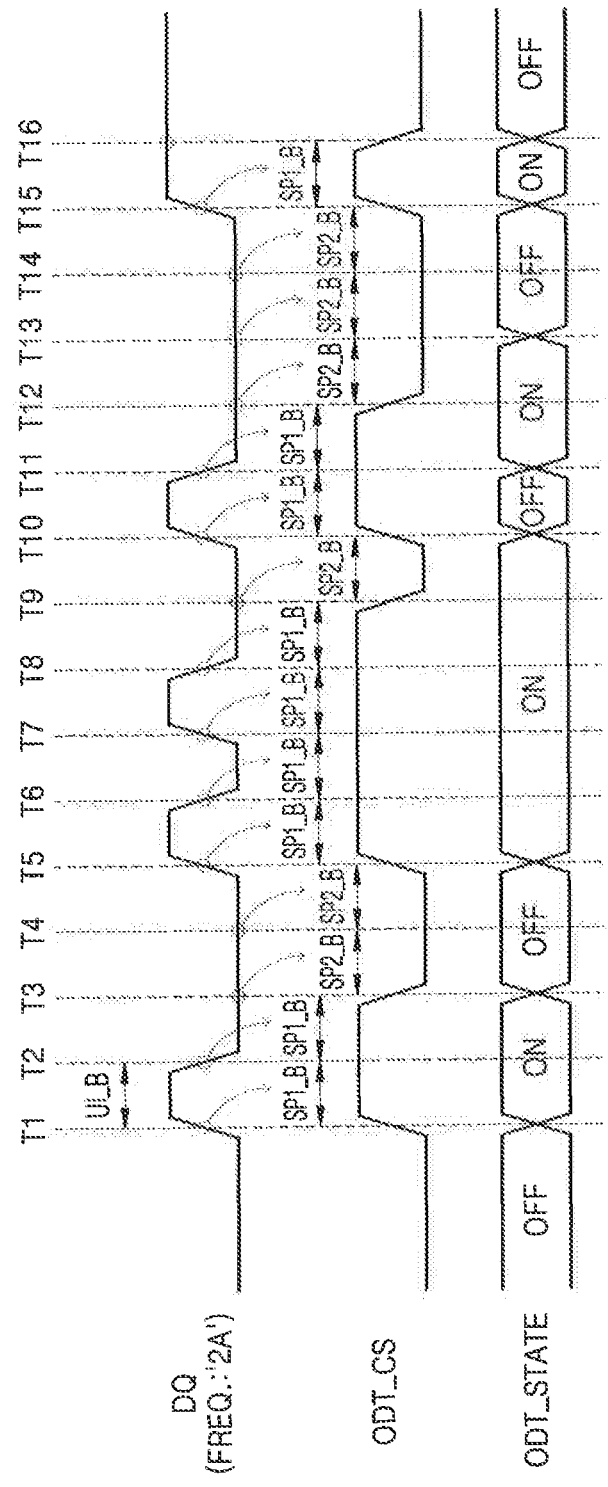
FIGS. 8 and 9 are timing diagrams for explaining methods of controlling an ODT circuit according to exemplary embodiments of the inventive concept.
Figure 9:
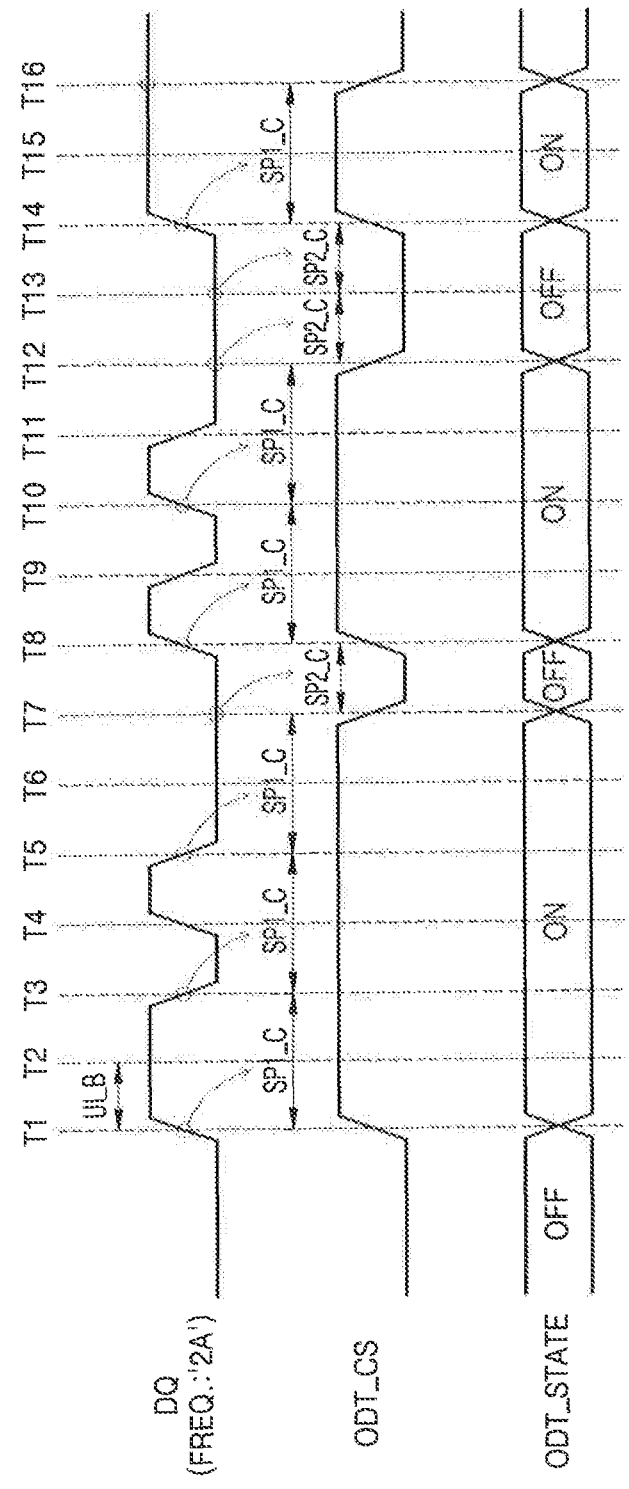

FIGS. 8 and 9 are timing diagrams for explaining methods of controlling an ODT circuit according to an exemplary embodiment of the inventive concept.

FIGS. 8 and 9 illustrate sustaining periods SP1_B and SP2_B of the turned-on and off states of the ODT circuit when the frequency of the data signal DQ is increased compared with FIG. 4. Referring to FIGS. 7A and 8, the data signal DQ is assumed to have a higher frequency, e.g., '2 A' Hz, than the data signal DQ shown in FIG. 4. The data signal DQ may have a unit interval UI_B corresponding to the frequency, '2 A' Hz, of the data signal DQ. When the frequency of the data signal DQ shown in FIG. 8 is increased compared with the frequency of the data signal DQ shown in FIG. 4, e.g., from 'A' Hz to '2 A' Hz, the ODT control signal generator 442A may set the ratios SP1_B/UI-B and SP2_B/UI-B of the durations of first and second sustaining periods SP1_B and SP2_B to the unit interval UI_B to '1'. This way the ratios SP1_B/UI-B and SP2_B/UI-B are the same as a respective one of the ratios SP1_A/UI-A and SP2_A/UI-A shown in FIG. 4. In other words, the ODT control signal generator 442A may set or change the duration of the sustaining periods SP1_B and SP2_B of the turned-on or off state of the ODT circuit with reference to the unit interval UI_B of the data signal DQ.

Referring to FIGS. 7A and 9, as the frequency of the data signal DQ increases, the ODT control signal generator 442A may control sustaining periods SP1_C and SP2_C of the turned-on or off state of the ODT circuit to be different from the sustaining periods SP1_B and SP2_B shown in FIG. 8. In particular, FIG. 9 illustrates an example where the ODT control signal generator 442A sets the first sustaining period SP1_C in which the ODT circuit maintains the turned-on state to be different from the second sustaining period SP2_C in which the ODT circuit maintains the turned-off state.

As shown in FIG. 9, the ODT control signal generator 442A may set the ratio SP1_C/UI-B of the duration of the first sustaining period SP1_C to the unit interval UI_B to '2', and set the ratio SP2_C/UI-B of the duration of the second sustaining period SP2_C to the unit interval UI_B to '1'. Thus, in considering that certain signal integrity characteristics may be deteriorated, as the frequency of the data signal DQ is increased, because of inter-signal interferences of the data signal DQ and the like, the ODT control signal generator 442A may control the ODT circuit to maintain the turned-on state longer than before. Therefore, the deterioration of the signal integrity characteristics is compensated.

It should be noted that the value '2' of the ratio SP1_C/UI_B and the value '1' of the ratio SP2_C/UI_B are merely exemplary purposes, and the inventive concept is not limited thereto. For example, the values of the ratios may be set variously.

Setting of the duration of the second sustaining period SP2_C to a value smaller than the duration of the first sustaining period SP1_C by the ODT control signal generator 442A is done to thoroughly remove the noise due to the impedance mismatching that may occur during the transition intervals of the data signal DQ. For example, at an eighth time T8 at which the level of the data signal DQ is changed from the logic low level to the logic high level, the ODT circuit is controlled to be turned on so that the noise generated during the transition of the data signal DQ at the eighth time T8 is removed.

Further, since the data signal pattern detector 441A may detect the level change of the data signal DQ at the timings when the sustaining periods SP1_C and SP2_C end, the data signal pattern detector 441A performs the detection operation a smaller number of times than the case of FIG. 8, thereby further reducing the power consumption in the detection operation.

Figure 10:
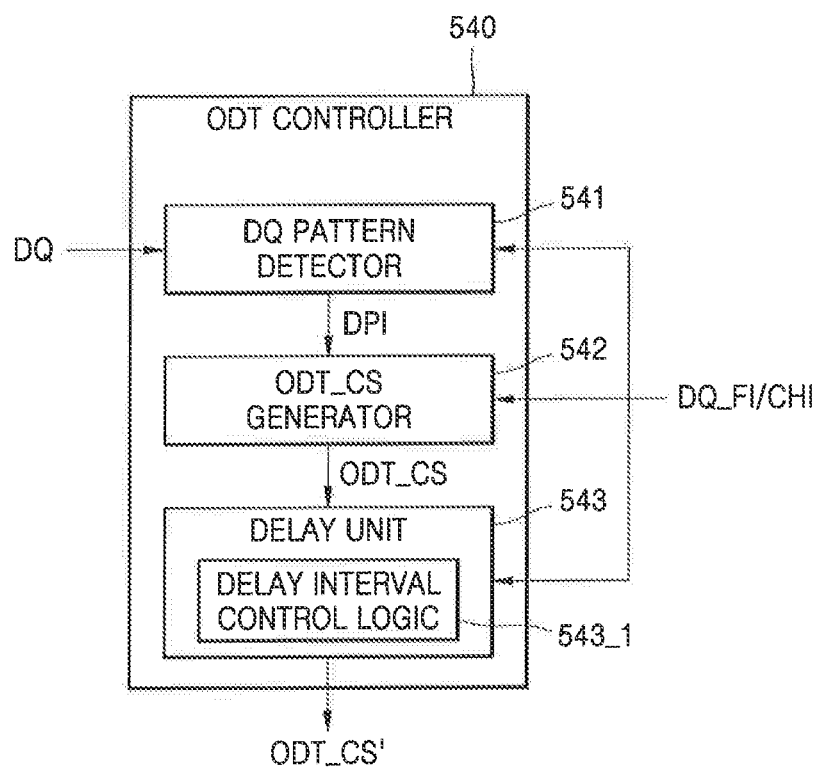
FIG. 10 is a block diagram of an ODT controller according to an exemplary embodiment of the inventive concept.

FIG. 10 is a block diagram of an ODT controller according to an exemplary embodiment of the inventive concept.

Referring to FIG. 10, an ODT controller 540 may include a data signal pattern detector 541, an ODT control signal generator 542, and a delay unit 543. The data signal pattern detector 541 may provide the ODT control signal generator 542 with the data pattern information DPI indicating the level transition of the data signal DQ, and the ODT control signal generator 542 may generate the ODT control signal ODT_CS based on the data pattern information DPI and provide the ODT control signal ODT_CS to the delay unit 543. The delay unit 543 may delay the ODT control signal ODT_CS by a prescribed delay time and provide the delayed ODT control signal ODT_CS' to the ODT circuit.

According to an exemplary embodiment of the inventive concept, the delay unit 543 may delay the ODT control signal ODT_CS, and change the ratio of the duration of the delay interval to the unit interval of the data signal DQ based on at least one of the data signal frequency information DQ_FI and the channel length information CHI. For example, delay interval control logic 543_1 may control the delay unit 543 with reference to the data signal frequency information DQ_FI such that the ratio of the duration of the delay interval to the unit interval of the data signal DQ increases as the frequency of the data signal DQ increases. However, the inventive concept is not limited thereto. For example, the delay interval control logic 543_1 may control the delay unit 543 with reference to the data signal frequency information DQ_FI such that the ratio of the duration of the delay interval to the unit interval of the data signal DQ increases as the frequency of the data signal DQ increases when the frequency of the data signal DQ is above a certain criterion. In addition, the delay interval control logic 543_1 may control the delay unit 543 such that the ratio of the duration of the delay interval to the unit interval of the data signal DQ decreases as the frequency of the data signal DQ increases when the frequency of the data signal DQ is below the criterion.

The delay interval control logic 543_1 may control the delay unit 543 with reference to the channel length information CHI such that the ratio of the duration of the delay interval to the unit interval of the data signal DQ increases as the length of the channel through which the data signal DQ is transmitted increases. However, the inventive concept is not limited thereto. For example, the delay interval control logic 543_1 may control the delay unit 543 with reference to the channel length information CHI such that the duration of the delay interval increases as the channel length increases when the channel length is above a certain criterion. In addition, the delay interval control logic 543_1 may control the delay unit 543 such that the duration of the delay interval decreases as the channel length is increases when the channel length is below the criterion.

According to the exemplary embodiment described above, in considering that the delay of the noise caused by the impedance mismatching differs according to the frequency of the data signal DQ and the channel length, the ODT controller 540 may control the turning-on and off of the ODT circuit with reference to the frequency of the data signal DQ and the channel length. Accordingly, the noise may be removed effectively.

Figure 11:
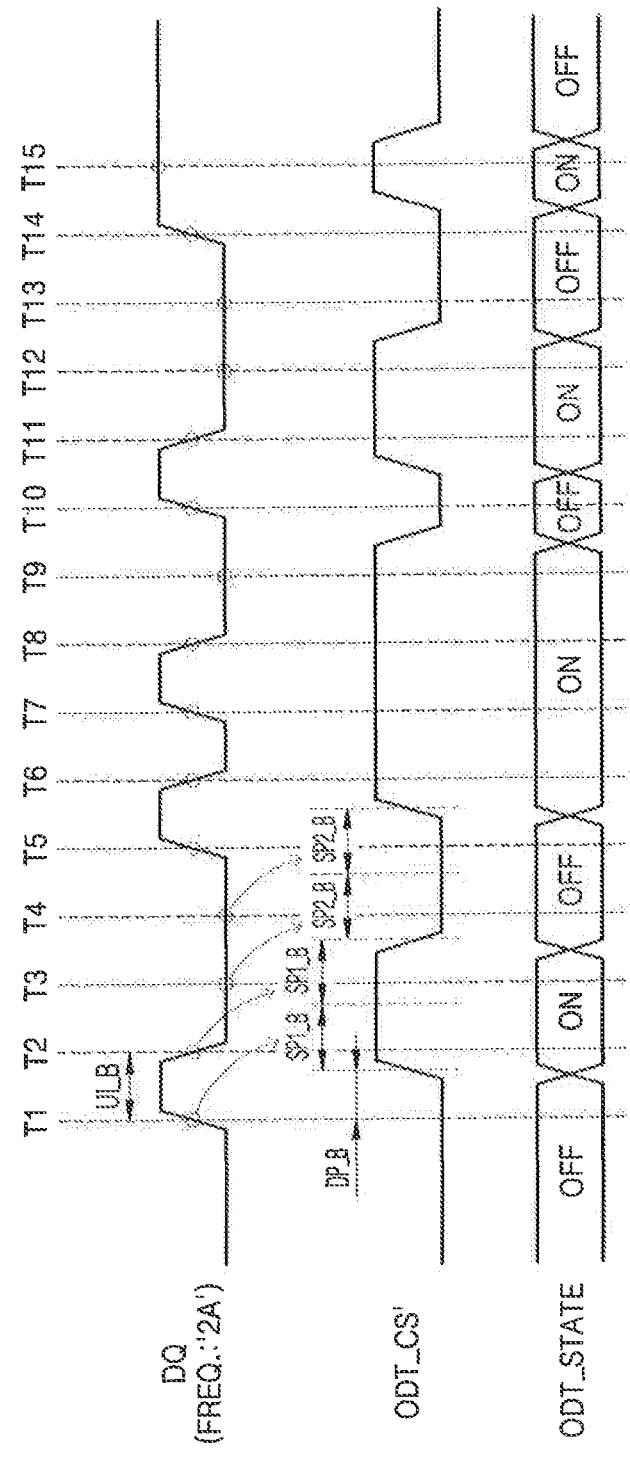
FIGS. 11 and 12 are timing diagrams for explaining methods of controlling an ODT circuit according exemplary embodiments of the inventive concept.
Figure 12:
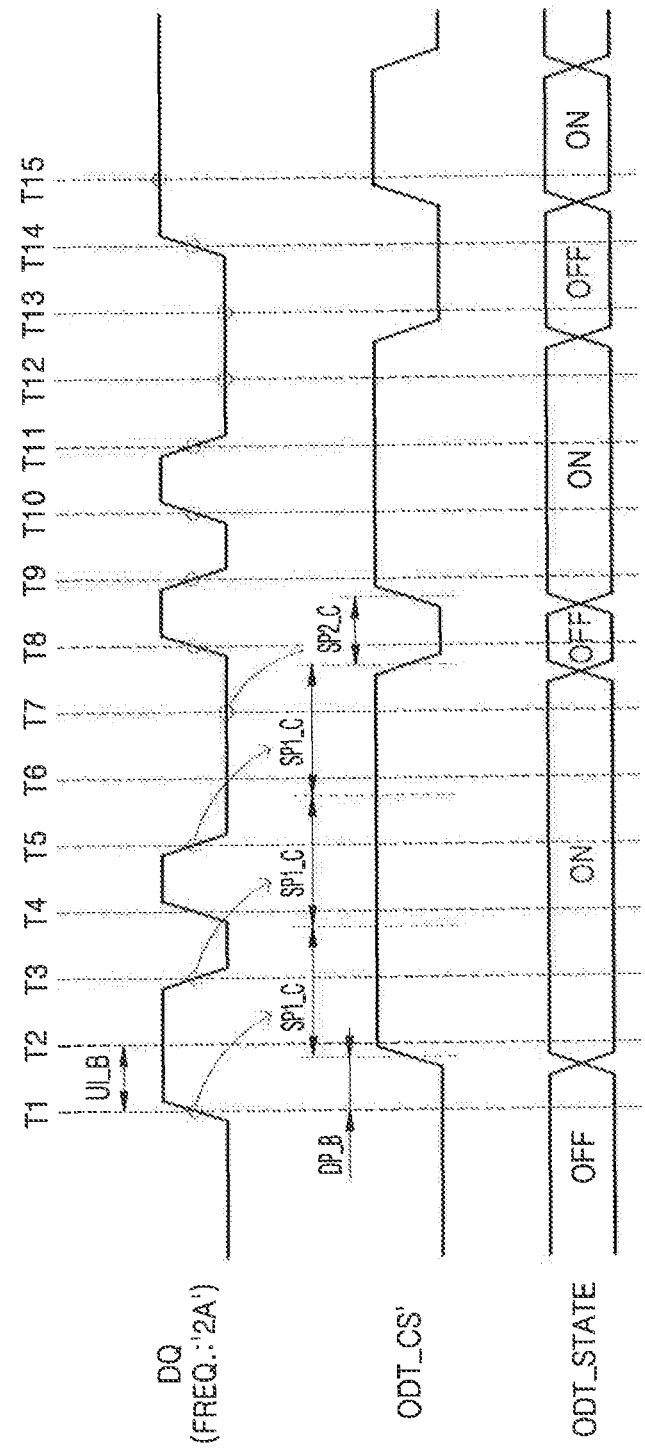

FIGS. 11 and 12 are timing diagrams for explaining methods of controlling an ODT circuit according to exemplary embodiments of the inventive concept.

FIG. 11 illustrates a delay interval DP_B of the delayed ODT control signal ODT_CS' when the frequency of the data signal DQ is increased compared with FIG. 6. Referring to FIGS. 10 and 11, the data signal DQ is assumed to have a higher frequency, e.g., '2 A' Hz, than the data signal DQ shown in FIG. 6. The data signal DQ may have the unit interval UI_B corresponding to the frequency, '2 A' Hz, of the data signal DQ. As described above, the delay unit 543 may change the duration of the delay interval in the delayed ODT control signal ODT_CS' with reference to the unit interval UI_B of the data signal DQ based on the frequency information of the data signal DQ. For example, the delay unit 543 may delay the ODT control signal ODT_CS by setting the ratio DP_B/UI_B of the duration of the delay interval DP_B to the duration of the unit interval UI_B to '0.7'. In other words, the delay unit 543 allows control of the turning-on and off of the ODT circuit by taking into account the increase of the delay of the noise due to the change of the frequency of the data signal DQ from 'A' Hz to '2 A' Hz. This is done, for example, by changing the duration of the delay interval DP_B in such a manner that the ratio DP_B/UI_B of the duration of the delay interval DP_B to the duration of the unit interval UI_B is larger than the value '0.5' of the ratio DP_A/UI_A in FIG. 6.

In FIG. 12 the duration of the delay interval DP_B in the delayed ODT control signal ODT_CS' and the durations of on/off state sustaining periods SP1_C and SP2_C of the turned-on or off state of the ODT circuit are changed when the frequency of the data signal DQ is increased as compared with FIG. 6. Referring to FIGS. 10 and 12, as the frequency of the data signal DQ is increased compared with the embodiment illustrated in FIG. 6, the ODT control signal generator 542 may change the duration of the on-state sustaining period SP1_C of the turned-on state of the ODT circuit, so that the ratio SP1_C/UI-B of the duration of the on-state sustaining period SP1_C to the unit interval UI_B is larger than the value '1' of the ratio SP1_B/UI-B in FIG. 6. This is done, for example, by setting the ratio SP1_C/UI-B of the duration of the on-state sustaining period SP1_C to the unit interval UI_B to '2'.

Similar to that described for FIG. 11, the delay unit 543 may change the duration of the delay interval in the delayed ODT control signal ODT_CS' with reference to the unit interval UI_B of the data signal DQ as the frequency of the data signal DQ is increased. As a result, the ODT controller 540 according to the present embodiment may effectively control the turning-on and off of the ODT circuit by changing both the duration of the delay interval DP_B and the duration of the sustaining period SP1_C according to the change in the frequency of the data signal DQ.

Figure 13:
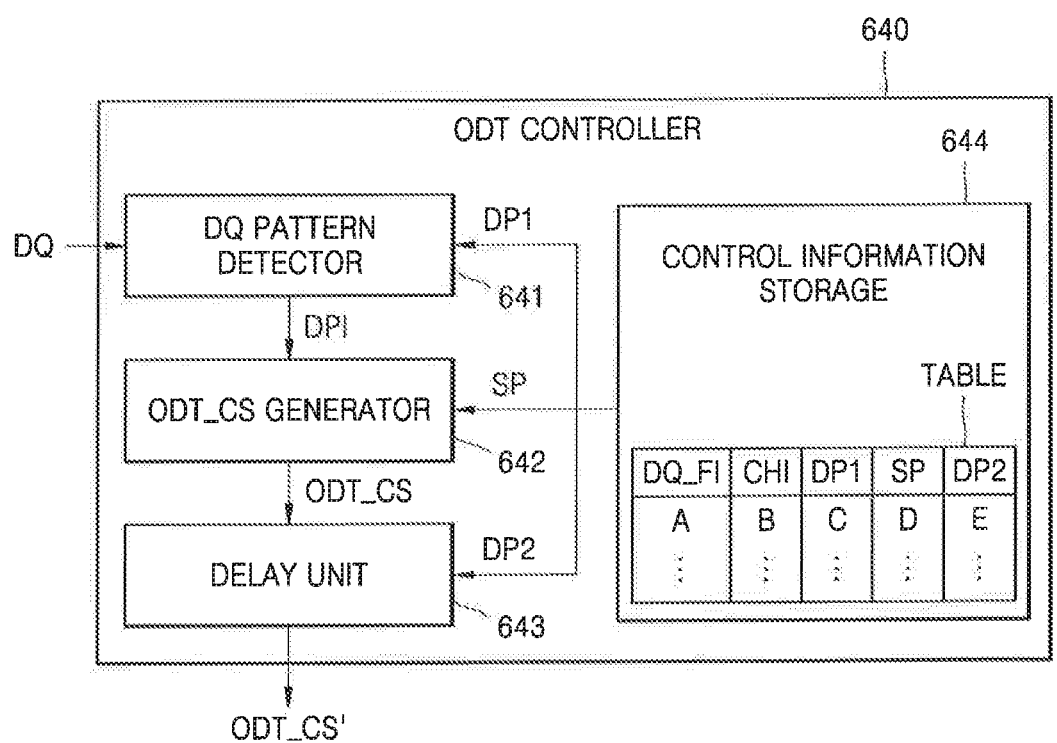
FIG. 13 is a block diagram of an ODT controller according to an exemplary embodiment of the inventive concept.

FIG. 13 is a block diagram of an ODT controller according to an exemplary embodiment of the inventive concept.

Referring to FIG. 13, an ODT controller 640 may include a data signal pattern detector 641, an ODT control signal generator 642, a delay unit 643, and a control information storage 644. According to the present embodiment, the data signal pattern detector 641 may detect the pattern of the data signal DQ, change the duration of the period for detecting the pattern of the data signal DQ based on at least one of the data signal frequency information DQ_FI and the channel length information CHI, and then, generate the data pattern information DPI. In addition, the ODT control signal generator 642 may generate the ODT control signal ODT_CS whose duration changes based on at least one of the frequency information DQ_FI of the data signal DQ and the channel length information CHI. The delay unit 643 may delay the ODT control signal ODT_CS by the delay interval that is determined by at least one of the frequency information DQ_FI of the data signal DQ and the channel length information CHI, and provide the delayed ODT control signal ODT_CS' to the ODT circuit.

In other words, the data signal pattern detector 641, the ODT control signal generator 642, and the delay unit 643 perform a series of operations to control the turning-on and off of the ODT circuit based on the frequency information DQ_FI of the data signal DQ and the channel length information CHI. The control information storage 644 may receive the frequency information DQ_FI of the data signal DQ and the channel length information CHI from the outside and store such information.

According to an exemplary embodiment of the inventive concept, the control information storage 644 may include a control table TABLE that contains the frequency information DQ_FI of the data signal DQ and the channel length information CHI along with information mapped into each of particular pairs of the frequency information DQ_FI and the channel length information CHI. The mapped information may include the detection period DPI associated with the data signal pattern detector 641, the sustaining period SP associated with the ODT control signal generator 642, and the delay interval DP2 associated with the delay unit 643.

When the frequency of the data signal DQ is 'A' and the channel length is 'B', the control information storage 644 may provide the detection period DP1 having a value of 'C', the sustaining period SP having a value of 'D', and the delay interval DP2 having a value of 'E' to the data signal pattern detector 641, the ODT control signal generator 642, and the delay unit 643, respectively. Each of the data signal pattern detector 641, the ODT control signal generator 642, and the delay unit 643 may perform a series of operations for controlling the turning-on and off of the ODT circuit based on received information. However, the inventive concept is not limited thereto, and may be modified in various ways. For example, the control information storage 644 may be included in at least one of the ODT control signal generator 642 and the delay unit 643. Further, the control information storage 644 may be disposed outside the ODT controller 640.

Figure 14:
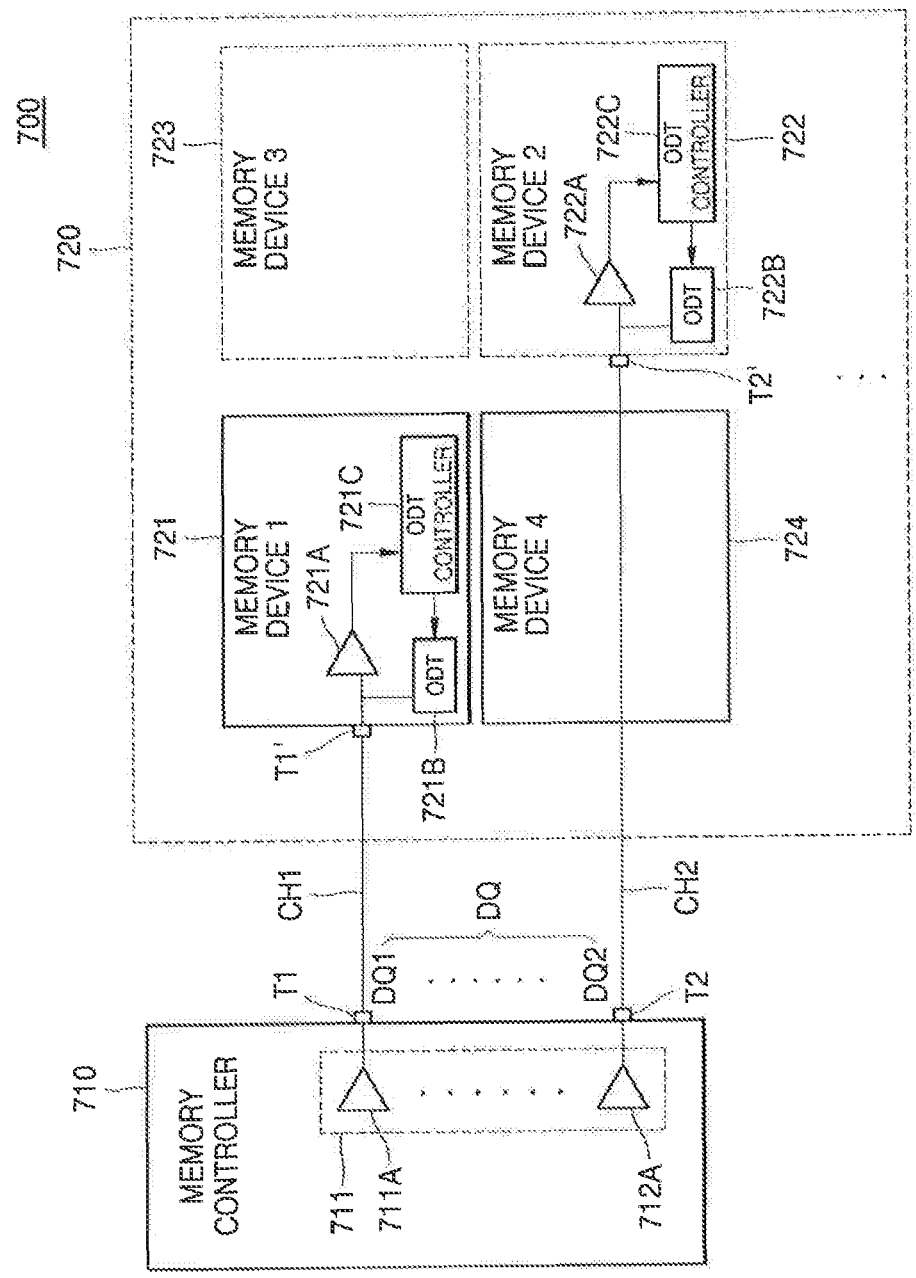
FIG. 14 is a block diagram of a memory system according to an exemplary embodiment of the inventive concept.

FIG. 14 is a block diagram of a memory system according to an exemplary embodiment of the inventive concept.

Referring to FIG. 14, a memory system 700 may include a memory controller 710 and a memory device group 720. The memory device group 720 may include a plurality of memory devices 721-724, and each of the memory devices 721-724 may be a volatile memory such as a dynamic random access memory (DRAM), a flash memory, a phase change random access memory (PRAM), a ferroelectric random access memory (FRAM), a resistive random access memory (RRAM), or a non-volatile memory such as a magnetic random access memory (MRAM). Further, the memory devices 721-724 may include both the volatile memory and the non-volatile memory, and may be implemented in a variety of other ways.

The memory controller 710 may control writing and reading of data to and from the memory devices 721-724. To provide the memory devices 721-724 with data signals DQ1 and DQ2, the memory controller 710 may include an output buffer unit 711 including a plurality of output buffers 711A and 712A, and a plurality of terminals T1 and T2 connected to the output buffer unit 711 and outputting the signals DQ1 and DQ2. Each of the memory devices 721-724 may include a terminal T1' or T2' configured to receive the signals DQ1 and DQ2 from the memory controller 710. Although, the memory device group 720 is described in terms of a first memory device 721 and a second memory device 722 hereinafter, it is noted that the inventive concept applicable to the first and second memory devices 721 and 722 may be applied to the other the memory devices 723 and 724.

The first memory device 721 may include an input buffer 721A configured to receive a first data signal DQ1 from the output buffer 711A of the memory controller 711, an ODT circuit 721B configured to perform impedance matching and remove noise generated while the first memory device 721 receives the first data signal DQ1, and an ODT controller 721C configured to control the turning-on and off of the ODT circuit 721B. The terminal T1' of the first memory device 721 is connected to the terminal T1 of the memory controller 710 through a first channel CH1. The first data signal DQ1 is transmitted through the first channel CH1.

The second memory device 722 may include an input buffer 722A configured to receive a second data signal DQ2 from the output buffer 712A of the memory controller 711, an ODT circuit 722B configured to perform impedance matching and remove noise generated while the second memory device 722 receives the second data signal DQ2, and an ODT controller 722C configured to control the turning-on and off of the ODT circuit 722B. The terminal T2' of the second memory device 722 is connected to the terminal T2 of the memory controller 710 through a second channel CH2. The second data signal DQ2 is transmitted through the second channel CH2.

As described above, the channels may be referred to as transmission lines connecting the terminals of the memory controller outputting the data signal and the terminals of the memory devices receiving the data signal. However, the channels may be referred to as transmission lines connecting the output buffers of the memory controller and the input buffers of the memory devices, for example. Hereinafter, the term 'channel length' is used to refer to the length of a transmission line between a terminal of the memory controller outputting the data signal and a terminal of the memory device receiving the data signal.

According to an exemplary embodiment of the inventive concept, the ODT controller 721C in the first memory device 721 and the ODT controller 722C in the second memory device 722 may control the turning-on and off of the ODT circuits 721B and 722B, respectively, based on channel length. Since the length of the second channel CH2 is longer than the length of the first channel CH1 in FIG. 14, the ODT controller 722C in the second memory device 722 may control the ODT circuit 722B after increasing the on-state sustaining period of the ODT circuit 722B or increasing the delay interval of the ODT control signal as compared with the ODT controller 721C in the first memory device 721. The techniques used to make the on-state sustaining period of the ODT circuit 722B and the delay interval of the ODT control signal longer correspond to those described above with reference to FIG. 7A, for example.

Figure 15:
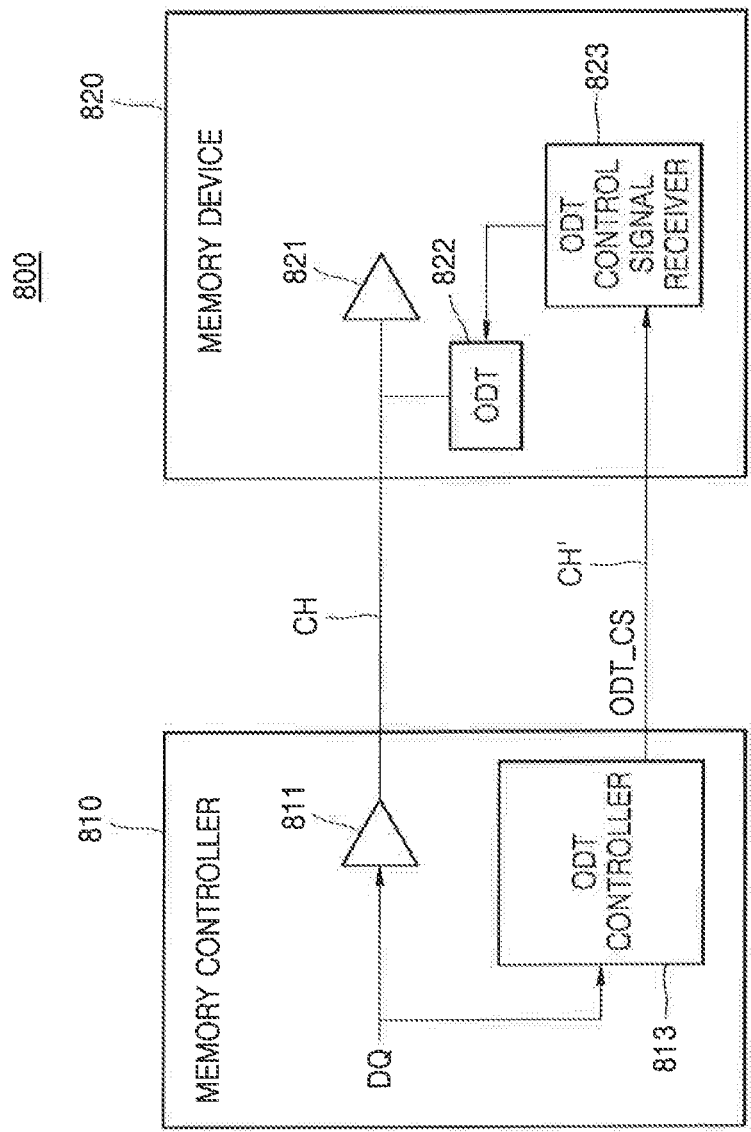
FIG. 15 is a block diagram of a memory system according to an exemplary embodiment of the inventive concept.

FIG. 15 is a block diagram of a memory system according to an exemplary embodiment of the inventive concept.

Referring to FIG. 15, a memory system 800 may include a memory controller 810 and a memory device 820. The memory controller 810 may include an output buffer unit 811 for outputting the data signal DQ to facilitate a write operation in the memory device 820, and an ODT controller 813 configured to control the turning-on and off of an ODT circuit 822 in the memory device 820. The memory device 820 may include an input buffer 821 configured to receive the data signal DQ, the ODT circuit 822 configured to provide a termination resistance component to an input stage of the input buffer 821, and an ODT control signal receiver 823 configured to receive the ODT control signal ODT_CS.

The ODT controller 813 may generate the ODT control signal ODT_CS by using the data signal DQ generated inside the memory controller 810 and provide the ODT control signal ODT_CS to the memory device 820 through a channel CH'. As described above, the ODT controller 813 may control the turning-on and off of the ODT circuit 822 according to the pattern of the data signal DQ, in particular, the frequency information of the data signal DQ and the length information of the channel CH through which the data signal DQ is transmitted.

Although it is shown in FIG. 15 that the ODT control signal receiver 823 receives the ODT control signal ODT_CS from the ODT controller 813 and transfers the ODT control signal ODT_CS to the ODT circuit 822, the inventive concept is not limited thereto. For example, the ODT circuit 822 may directly receive the ODT control signal ODT_CS from the ODT controller 813 through the channel CH' to be turned on or off in response to the ODT control signal ODT_CS.

Figure 16:
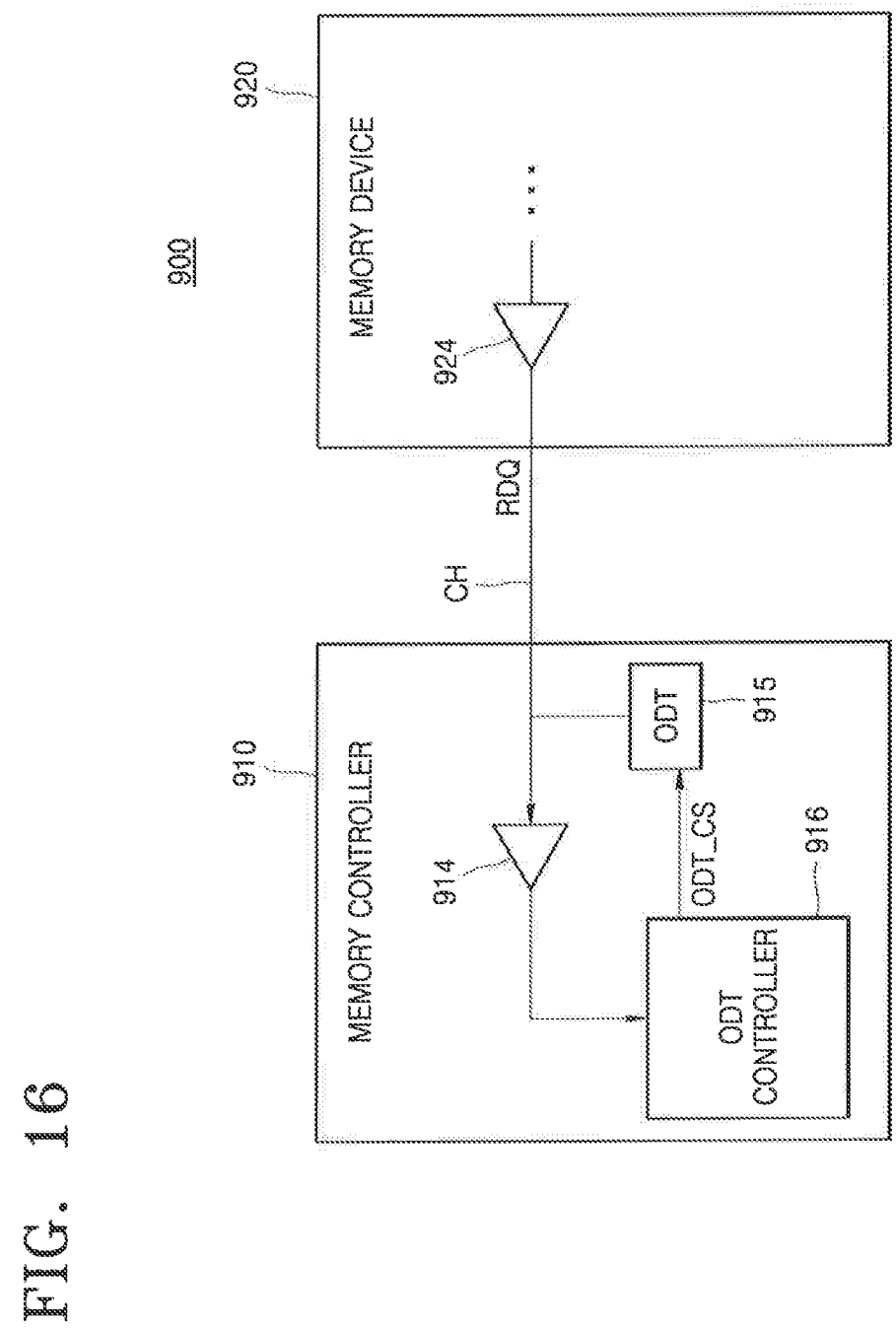
FIG. 16 is a block diagram of a memory system according to an exemplary embodiment of the inventive concept.

FIG. 16 is a block diagram of a memory system according to an exemplary embodiment of the inventive concept.

Referring to FIG. 16, a memory system 900 may include a memory controller 910 and a memory device 920. The memory controller 910 may control reading of data stored in the memory device 920, and the memory device 920 may include an output buffer 924 for outputting read-out data signal RDQ to the memory controller 910. The memory controller 910 may include an input buffer 914 configured to receive the read-out data signal RDQ through a channel CH, an ODT circuit 915 configured to provide a termination resistance component to an input stage of the input buffer 914, and an ODT controller 916 configured to control the turning-on and off of the ODT circuit 915.

The ODT controller 916 may receive the read-out data signal RDQ from the input buffer 914, and generate the ODT control signal ODT_CS by using the read-out data signal RDQ. As described above, the ODT controller 916 may control the turning-on and off of the ODT circuit 915 according to the pattern of the read-out data signal RDQ, in particular, the frequency information of the read-out data signal RDQ and the length information of the channel CH through which the read-out data signal RDQ is transmitted.

Figure 17:
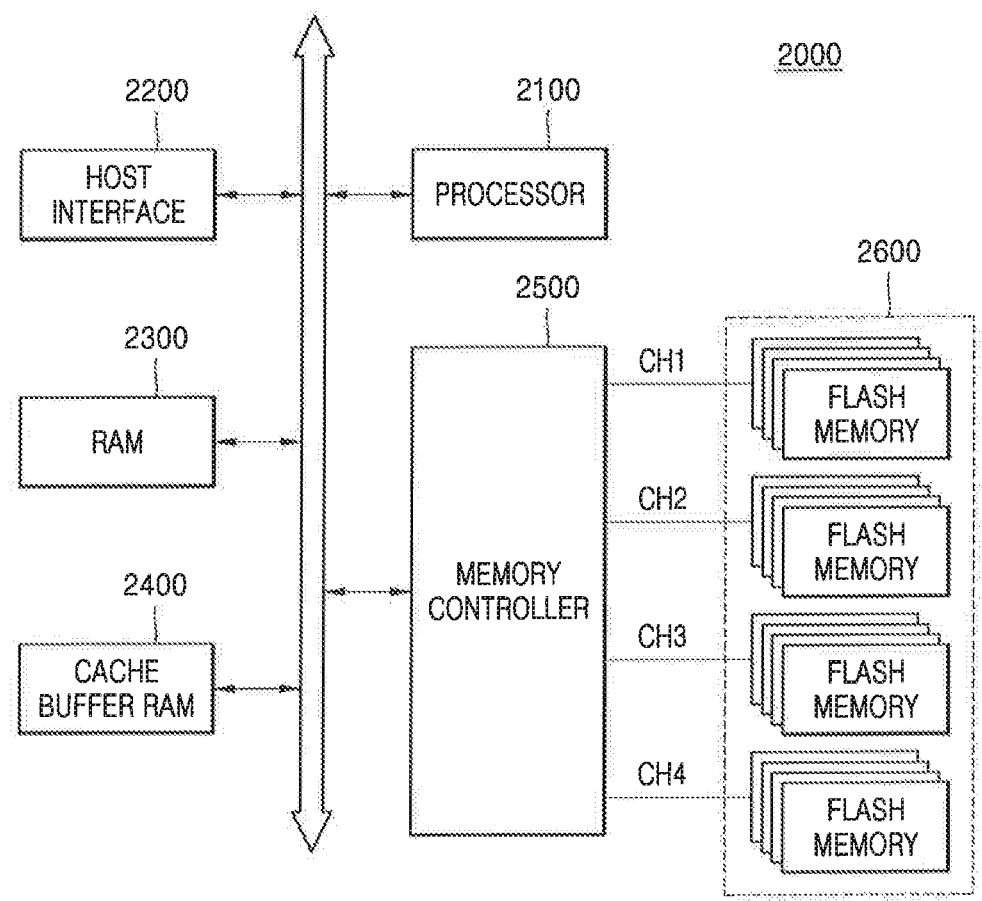
FIG. 17 is a block diagram of a solid state drive (SSD) according to an exemplary embodiment of the inventive concept.

FIG. 17 is a block diagram of a solid state drive (SSD) according to an exemplary embodiment of the inventive concept.

Referring to FIG. 17, a SSD 2000 may include a processor 2100, a host interface 2200, a RAM 2300, a cache buffer RAM 2400, a memory controller 2500, and a plurality of flash memory devices 2600. According to an exemplary embodiment of the inventive concept, each of the flash memory devices 2600 may include an input buffer configured to receive a data signal from the memory controller 2500, and an ODT circuit configured to provide a termination resistance component to an input stage of an input buffer of the flash memory device. In addition, each of the flash memory devices 2600 may include an ODT controller configured to control the turning-on and off of the ODT circuit according to the pattern of the data signal. In an exemplary embodiment of the inventive concept, however, the memory controller 2500, instead of the flash memory devices 2600, may include an ODT controller configured to control the turning-on and off of the ODT circuits in the plurality of flash memory devices 2600.

The host interface 2200 exchanges data with a host under a control of the processor 2100. The host interface 2200 fetches a command and an address from the host to transfer to the processor 2100 through a central processing unit (CPU) bus. Here, the host interface 2200 may be a serial advanced technology attachment (SATA) interface, a parallel ATA (PATA) interface, or an external SATA (ESATA) interface. Data to be received from the host through the host interface 2200 or to be transferred to the host may be transferred through the cache buffer RAM 2400, under a control of the processor 2100, without passing through the CPU bus.

The memory controller 2500 may exchange data with the flash memory devices 2600 via a plurality of channels CH1 to CH4. The data provided to the flash memory devices 2600 may be used for a storage. In addition, the processor 2100 and the memory controller 2500 may be implemented by a single advanced RISC machine (ARM) processor.

An exemplary embodiment of the inventive concept provides an ODT circuit that allows an effective control of a termination operation so as to enhance signal integrity in a memory device, facilitate the reduction of the power consumption required for the operation of the ODT circuit, and mitigate heating issues, thereby increasing the overall performance of the memory device.

While the inventive concept has been particularly shown and described with reference to exemplary embodiments thereof, it will be understood that various changes in form and details may be made therein without departing from the spirit and scope of the inventive concept as defined by the following claims.

What is claimed is:

1. An on-die termination circuit connected to an input buffer that receives a data signal, the on-die termination circuit comprising:
    at least one termination resistor connected to the input buffer; and
    at least one switching device configured to control a connection between the termination resistor and the input buffer;
    wherein the switching device is turned on or off according to information about the data signal,
    wherein the information about the data signal includes at least one of pattern information of the data signal, frequency information of the data signal, and length information of a channel through which the data signal is transmitted,
    wherein the switching device is turned on or off according to a determination result after a predetermined delay interval,
    wherein the predetermined delay interval is changed based on the frequency information of the data signal or the channel length information,
    wherein the predetermined delay interval increases with respect to a unit interval of the data signal as a channel length increases.

2. The on-die termination circuit of claim 1, wherein the switching device is turned on or off according to the pattern information of the data signal.

3. The on-die termination circuit of claim 2, wherein the pattern information of the data signal indicates a level change of the data signal,
    wherein the switching device is turned on when a level of the data signal changes and is turned off when the level of the data signal remains constant for a predetermined time.

4. The on-die termination circuit of claim 1, wherein the predetermined delay interval increases with respect to the unit interval of the data signal as a frequency of the data signal increases.

5. The on-die termination circuit of claim 1, wherein the switching device is kept in a turned-on state or a turned-off state for a predetermined sustaining period.

6. The on-die termination circuit of claim 5, wherein the switching device maintains the turned-on state for a first sustaining period and the turned-off state for a second sustaining period.

7. The on-die termination circuit of claim 5, wherein a length of the predetermined sustaining period is changed with respect to the unit interval of the data signal based on the frequency information of the data signal or the channel length information.

8. The on-die termination circuit of claim 7, wherein the length of the predetermined sustaining period increases with respect to the unit interval of the data signal as a frequency of the data signal increases.

9. The on-die termination circuit of claim 7, wherein the length of the predetermined sustaining period increases with respect to the unit interval of the data signal as the channel length increases.

* * * * *